United States Patent [19]

Kondou et al.

[11] Patent Number: 4,972,517
[45] Date of Patent: Nov. 20, 1990

[54] DRIVER CIRCUIT RECEIVING INPUT VOLTAGE AND PROVIDING CORRESPONDING OUTPUT VOLTAGE

[75] Inventors: Harufusa Kondou; Takeo Nakabayashi, both of Hyogo, Japan

[73] Assignee: Mitsubishi Denki Kabushiki Kaisha, Tokyo, Japan

[21] Appl. No.: 318,284

[22] Filed: Mar. 3, 1989

[30] Foreign Application Priority Data

Mar. 4, 1988 [JP] Japan .................. 63-52047

[51] Int. Cl.$^5$ .......................... H03K 3/01; H03K 3/26
[52] U.S. Cl. .................................. 307/270; 307/475; 307/557; 307/494
[58] Field of Search ............... 307/475, 270, 296.4, 307/557, 494; 330/252

[56] References Cited

U.S. PATENT DOCUMENTS

| | | | |
|---|---|---|---|
| 3,780,316 | 12/1973 | Wilhelm | 307/254 |
| 4,583,203 | 4/1986 | Monk | 307/475 |
| 4,591,739 | 5/1986 | Nagano | 307/475 |
| 4,727,265 | 2/1988 | Nanbu et al. | 307/475 |
| 4,748,346 | 5/1988 | Emori | 307/475 |
| 4,788,458 | 11/1988 | Kinoshita et al. | 307/475 |

*Primary Examiner*—Stanley D. Miller
*Assistant Examiner*—Richard Roseen
*Attorney, Agent, or Firm*—Lowe, Price, LeBlanc, Becker & Shur

[57] ABSTRACT

A first comparator compares a voltage of a pair of primary terminals of a pulse transformer with a first reference voltage, to apply an output voltage corresponding to the voltage difference therebetween to a gate of an N channel MOSFET. The N channel MOSFET is responsive to the output voltage for controlling current flowing through a primary side of a pulse transformer. Consequently, even if the impedance of a load connector to a pair of secondary terminals of the pulse transformer is fluctuated, a voltage between the pair of secondary terminals is kept constant. A second comparator compares the output voltage of the first comparator with a second reference voltage, to apply an output voltage corresponding to the voltage difference therebetween to a gate of a P channel MOSFET. When the load impedance becomes low, the P channel MOSFET performs control such that the output voltage of the second comparator does not exceed a predetermined value. Consequently, current flowing through the primary side of the pulse transformer is limited not to exceed a constant value. Thus, a voltage between output terminals does not exceed a constant value.

14 Claims, 7 Drawing Sheets

— AT THE TIME OF GENERATING POSITIVE PULSE
---- AT THE TIME OF GENERATING NEGATIVE PULSE

DRIVER CIRCUIT RECEIVING INPUT VOLTAGE AND PROVIDING CORRESPONDING OUTPUT VOLTAGE

BACKGROUND OF THE INVENTION

1. Field of the Invention

The present invention relates generally to driver circuits for providing predetermined output voltages corresponding to respective output load impedances depending on fluctuations in output load.

2. Description of the Background Art

Figure 1:
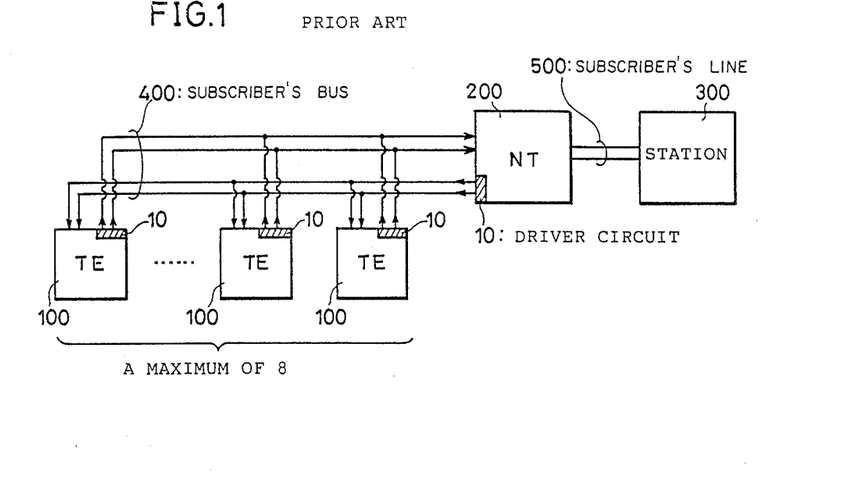
FIG. 1 is a diagram showing a structure of a basic interface of an ISDN.

FIG. 1 is a diagram showing a structure of a basic interface of an ISDN (Integrated Services Digital Network) described in Recommendation I. 430 of the CCITT. This basic interface of the ISDN is employed for high-speed digital communication using the existing two-wire telephone line (subscriber's line) at a data rate of 192 Kbps.

In FIG. 1, a station 300 and a network termination 200 are connected through a subscriber's line 500. A maximum of 8 terminal equipments 100 are connected to the network termination 200 through a subscriber's bus 400. The network termination 200 and each of the terminal equipments 100 are respectively provided with driver circuits line drivers) 10 for respectively driving the subscriber's bus 400. Outputs of the driver circuits 10 in the eight terminal equipments 100 are connected in parallel to an input of the network termination 200. An output of the driver circuit 10 in the network termination 200 is connected to inputs of the eight terminal equipments 100. Thus, an output load impedance of each of the driver circuits 10 is changed depending on an operating state of another terminal equipment 100 or the network termination 200.

Figures 2A, 2B:
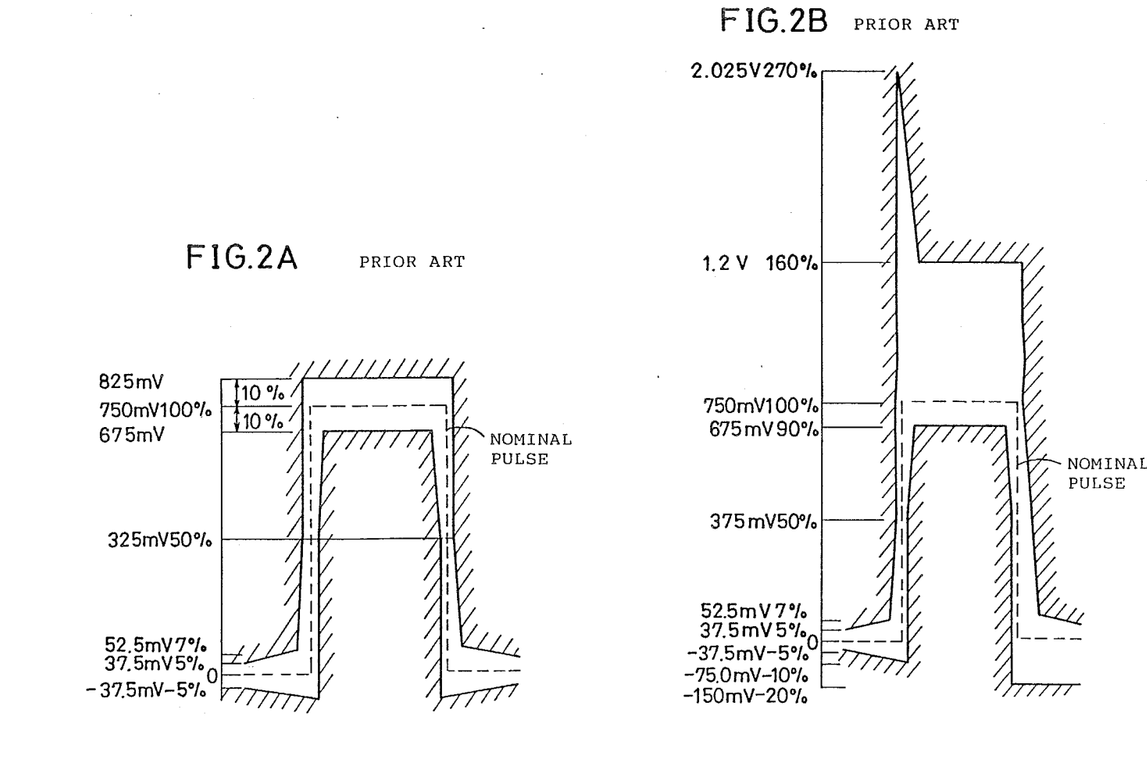

According to the Recommendation I. 430 of the CCITT, a pulse mask showing an allowable value of an output pulse shape of a driver circuit is determined for cases where load impedances are respectively 5.6Ω, 50Ω and 400Ω. FIG. 2A shows the pulse mask at the time of the load of 50Ω, and FIG. 2B shows the pulse mask at the time of the load of 400Ω. FIGS. 2A and 2B mean that the output pulse shape must be included in an allowable region encircled by hatching. In addition, it is determined that an amplitude value (peak value) of the output pulse at the time of the load of 5.6Ω must be 20% (150mV) or less of an amplitude value of a nominal pulse shown in FIG. 2A. As obvious from FIGS. 2A and 2B, the amplitude value of the output pulse must be 150mV or less at the time of the load of 5.6Ω, in the range of 675 to 825mV at the time of the load of 50Ω, and in the range of 675 to 1200mV at the time of the load of 400Ω. Thus, an output voltage of the driver circuit 10 must be changed depending on the load impedance.

Figure 3:
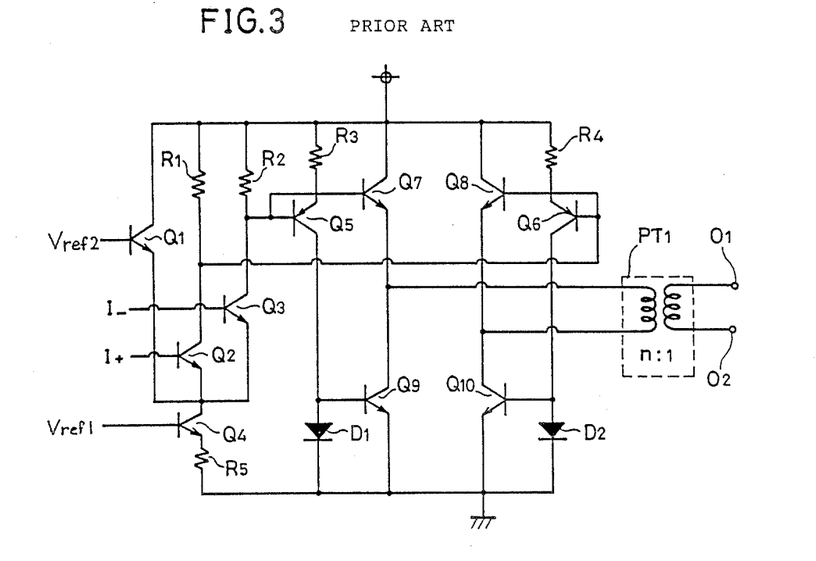
FIG. 3 is a diagram showing a structure of one example of a conventional driver circuit.

FIG. 3 is a diagram showing one example of a driver circuit satisfying the above described determination, which is described in, for example, Proceedings of 1986 National Conference of Institute of Electronics and Communication Engineers of Japan (2013, pp. 9–42).

In FIG. 3, when an input signal $I_+$ attains an "H" level, a potential difference $\Delta V$ occurs between a base of a bipolar transistor Q7 and a base of a bipolar transistor Q8. Since the bipolar transistor has the property that a voltage between base and emitter becomes constant, i.e., approximately 0.6V at the on-time, this potential difference $\Delta V$ is applied between primary terminals of a pulse transformer PT1 without any fluctuations. Consequently, a voltage of a value obtained by dividing the potential difference $\Delta V$ by the turns ratio appears between secondary output terminals O1 and O2. Therefore, if a load impedance of a load connected between the output terminals O1 and O2 varies, an equal voltage is outputted. Thus, if the circuit constant is set such that a voltage appearing between the output terminals O1 and O2 becomes 750mV, a pulse mask at the time of the loads of 50Ω and 400Ω can be satisfied.

On the other hand, when the load impedance becomes small, current flowing through the pulse transformer PT1 attempts to increase to keep the voltage between the output terminals O1 and O2 at a constant voltage. However, base potentials are respectively applied to bipolar transistors Q9 and Q10 by diodes D1 and D2. Therefore, current of a given value or more does not flow through the transistors Q9 and Q10. Thus, the current flowing through the transistors Q9 and Q10 is limited, so that a voltage of the output pulse at the time of the load of 5.6Ω is suppressed to 150mV or less. Meanwhile, at the time of the loads of 50Ω and 400Ω, the current flowing through the transistors Q9 and Q10 is less, so that the above described current limiting mechanism does not work.

Additionally, when an input signal $I_-$ is brought to the "H" level, pulses in the opposite directions are respectively outputted from the output terminals O1 and O2. Thus, in this driver circuit, a pulse of both positive and negative polarities can be outputted.

However, the above described driver circuit is constituted by a bipolar transistor. Thus, in order to form this driver circuit, along with another digital circuit, as an LSI (Large-Scaled Integrated Circuit), the digital circuit must be constituted by a bipolar device, or a digital circuit comprising a MOS device and a driver circuit comprising a bipolar device must be incorporated with each other in hybrid configuration using a special process such as an expensive Bi-CMOS (Bipolar-Complementary Metal Oxide Semiconductor) process. With respect to a large-scaled digital circuit, it is desirable that the digital circuit is constituted by a CMOS device, in which case the cost is lowered, and high density and low power consumption can be achieved. Thus, in either one of the above described methods, the cost is raised in order to form a driver circuit, along with another digital circuit, as an LSI.

Figure 4:
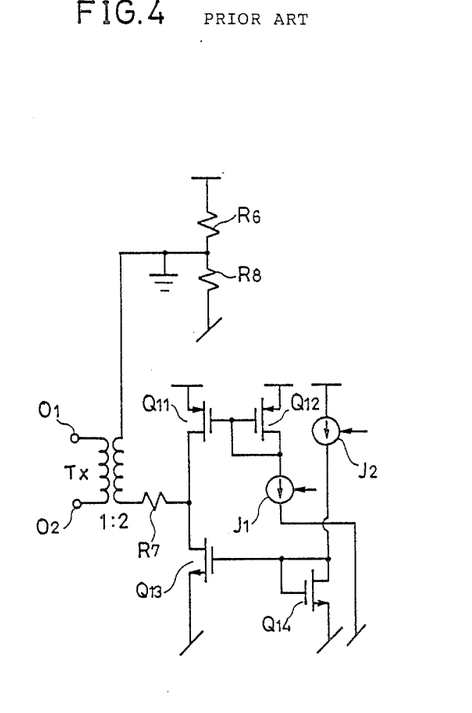
FIG. 4 is a diagram showing a structure of another example of the conventional driver circuit.

Additionally, FIG. 4 is a diagram showing another example of the driver circuit satisfying the pulse mask in Recommendation I. 430 of the CCITT. This driver circuit is described in DIGEST OF TECHNICAL PAPERS OF 1988 IEEE International Solid-State Circuits Conference, pp. 108–109, pp. 317. This driver circuit comprises two controllable current sources J1 and J2, MOS transistors Q11 and Q12 constituting a first current mirror circuit, and MOS transistors Q13 and Q14 constituting a second current mirror circuit. A pulse is outputted between output terminals O1 and O2 connected to a secondary side of a pulse transformer Tx in response to a control signal applied to the current source J1 or a control signal applied to the current source J2.

In this driver circuit, a pulse voltage is adjusted by current control. Current flowing through the pulse transformer Tx is determined depending on resistance values of resisters R6 to R8 and the MOS transistors Q11 to Q14. However, it seems that it is difficult to precisely set the resistance values of the devices to predetermine values, respectively, in manufacturing processes. In addition, the resistance values of the devices are changed depending on the temperature. Thus, adjustment is required. In general, it is more difficult in circuit techniques to precisely keep constant current flowing through a circuit, as compared with to precisely keep constant a voltage.

SUMMARY OF THE INVENTION

An object of the present invention is to provide a driver circuit capable of accurately outputting predetermined output voltages corresponding to respective output load impedances depending on fluctuations in output load impedance.

Another object of the present invention is to provide a driver circuit capable of accurately outputting predetermined output voltages corresponding to respective output load impedances depending on fluctuations in output load impedance which circuit is incorporated with a CMOS digital circuit in hybrid configuration at low cost.

Still another object of the present invention is to provide a driver circuit capable of accurately outputting a predetermined output voltage which circuit is capable of simple manufacture.

A further object of the present invention is to provide a driver circuit capable of obtaining an output pulse shape satisfying a pulse mask determined in Recommendation I. 430 of the CCITT.

In order to attain the above described objects, the driver circuit according to the present invention comprises a pair of input terminals, a pair of output terminals, voltage transforming means, first comparing means, a first field effect device, second comparing means, and a second field effect device. The voltage transforming means has a pair of primary terminals connected to the pair of input terminals and a pair of secondary terminals connected to the pair of output terminals. The first comparing means compares a voltage between the pair of input terminals with a predetermined first reference voltage, to provide an output voltage corresponding to the difference therebetween. The first field effect device has a control terminal receiving an output voltage of the first comparing means, which controls current flowing through the voltage transforming means such that the voltage between the pair of input terminals becomes equal to the first reference voltage. The second comparing means compares the output voltage of the first comparing means with a predetermined second reference voltage, to provide an output voltage corresponding to the difference therebetween. The second field effect device has a control terminal receiving the output voltage of the second comparing means, which performs control such that the absolute value of the output voltage of the first comparing means does not exceed a predetermined value.

The first field effect device in the driver circuit according to the present invention is responsive to the output voltage of the first comparing means for controlling current flowing on a primary side of the voltage transforming means such that the voltage between the pair of input terminals becomes equal to the first reference voltage. Therefore, even if the impedance of a load connected between the pair of output terminals is fluctuated, a voltage between the output terminals is kept constant.

Additionally, when the load impedance becomes low, the current flowing on the primary side of the voltage transforming means is increased to attempt to keep constant the voltage between the output terminals, so that the output voltage of the first comparing means is increased. However, when the load impedance becomes lower than a constant value, the second field effect device performs control such that the output voltage of the second comparing means does not exceed a predetermined value, so that the current flowing on the primary side of the voltage transforming means is limited not to exceed a constant value. Therefore, the voltage between the output terminals does not exceed a constant value. Thus, if the load impedance is large to some extent, control is performed such that the output voltage becomes a predetermined constant voltage. On the contrary, when the load impedance is small, control is performed such that the output voltage does not exceed a predetermined constant voltage.

Meanwhile, in circuit techniques, it is easy to generate exact reference voltages. In addition, it is possible to make a voltage ratio constant irrespective of fluctuations in temperature and power-supply voltage. In the driver circuit according to the present invention, the voltage between the output terminals is controlled by comparison of voltages, so that voltage control can be precisely performed.

As described in the foregoing, according to the present invention, even if the load impedance connected between the output terminals fluctuates, the output voltage is kept at a predetermined constant value, and control is performed such that the output voltage does not exceed a predetermined voltage if the output load impedance becomes a constant value or less. In addition, since the driver circuit according to the present invention comprises two comparing means and two field effect devices, the driver circuit can be constituted by a CMOS circuit, so that the driver circuit is incorporated together with another digital CMOS circuit in hybrid configuration at low cost. Furthermore, since the output voltage is adjusted by comparison of voltages, precise voltage adjustment can be made irrespective of the change in temperature and fluctuations in power-supply voltage, so that trimming is not required.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A and 2B are diagrams showing an output pulse mask according to Recommendation I. 430 of the CCITT, where FIG. 2A shows a pulse mask at the time of a load of 50Ω and FIG. 2B shows a pulse mask at the time a load of 400Ω;

DESCRIPTION OF THE PREFERRED EMBODIMENTS

Referring to the figures, an embodiment of the present invention will be described.

Figure 5:
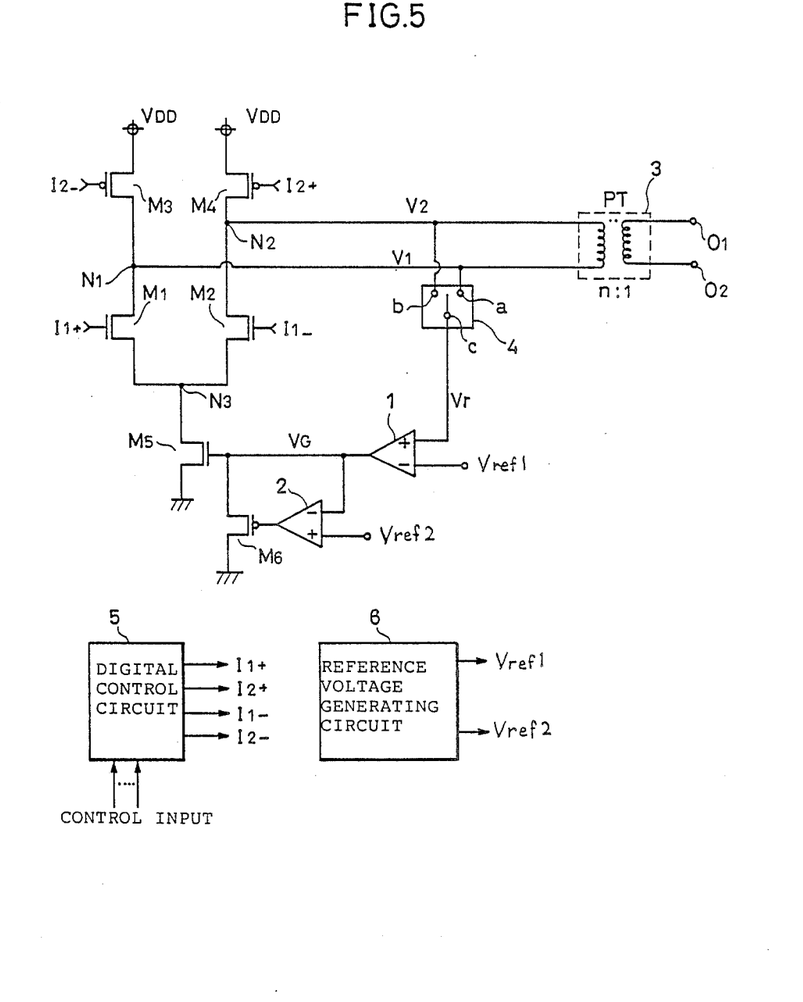
FIG. 5 is a diagram showing a circuit structure of a driver circuit according to one embodiment of the present invention.

FIG. 5 is a circuit diagram showing a structure of a driver circuit according to one embodiment of the present invention.

This driver circuit comprises a first comparator 1 comprising an operational amplifier, a second comparator 2 comprising an operational amplifier, a pulse transformer 3, a switching device 4, N channel MOSFETs M1, M2 and M5, and P channel MOSFETs M3, M4 and M6. The MOSFET M1 is coupled between a node N1 and a node N3, which has its gate receiving an input signal $I1_+$. The MOSFET M2 is coupled between a node N2 and the node N3, which has its gate receiving an input signal $I1_-$. The MOSFET M3 is coupled between a power-supply potential $V_{DD}$ and the node N1, which has its gate receiving an input signal $I2_-$. The MOSFET M4 is coupled between the power-supply potential $V_{DD}$ and the node N2, which has its gate receiving an input signal $I2_+$. In addition, primary terminals of the pulse transformer 3 are respectively connected to the nodes N1 and N2. Secondary terminals of the pulse transformer 3 are respectively connected to output terminals O1 and O2. The turns ratio of the pulse transformer 3 is n:1. The switching device 4 has a terminal a connected to the node N1 and a terminal b connected to the node N2.

The comparator 1 has its non-inverted input terminal receiving a controlled voltage Vr from a switching terminal c of the switching device 4 and its inverted input terminal receiving a first reference voltage $Vref_1$. The second comparator 2 has its non-inverted input terminal receiving an output voltage $V_G$ of the first comparator 1 and its non-inverted input terminal receiving a second reference voltage $Vref_2$. Furthermore, the MOSFET M5 is connected between the node N3 and a ground potential, which has its gate receiving the output voltage $V_G$ of the first comparator 1. The MOSFET M6 is coupled between an output terminal of the first comparator 1 and the ground potential, which has its gate receiving an output voltage of the second comparator 2. The digital control circuit 5 is responsive to a control input for outputting the above described four input signals $I1_+$, $I1_-$, $I2_+$, $I2_-$. A reference voltage generating circuit 6 generates the first reference voltage $Vref_1$ and the second reference voltage $Vref_2$.

Description is now made on an operation of this driver circuit. When the input signals $I1_+$ and $I2_-$ are at an "H" level and the input signals $I1_-$ and $I2_+$ are at an "L" level, the MOSFETs M1 and M4 are turned on, so that current flows from the power-supply potential to the ground potential through the MOSFET M4, the pulse transformer 3, the MOSFET M1 and the MOSFET M5. Consequently, a positive pulse is outputted between the output terminals O1 and O2.

On the contrary, when the input signals $I1_-$ and $I2_+$ are at the "H" level and the input signals $I1_+$ and $I2_-$ are at the "L" level, the MOSFETs M2 and M3 are turned on, so that current flows from the power-supply potential $V_{DD}$ to the ground potential through the MOSFET M3, the pulse transformer 3, the MOSFET M2 and the MOSFET M5. Consequently, a negative pulse is outputted between the output terminals O1 and O2. In the above described manner, this driver circuit can output a pulse of both positive and negative polarities.

The switching device 4, the first comparator 1, the second comparator 2 and the MOSFET M6 constitute a control system. This control system is employed in common with respect to both positive and negative pulses, which has a structure favorable to generate the positive and negative pulses in a balanced manner. The switching device 4 is switched to the side of the terminal a when the positive pulse is outputted while being switched to the side of the terminal b when the negative pulse is outputted.

Description is now made on control of the height of an output pulse by this control system. A case is herein described in which the positive pulse is outputted.

Since the turns ratio of the pulse transformer 3 is n:1, n times the height of a pulse outputted between the output terminals O1 and O2 is the difference between a potential V2 of the node N2 and a potential V1 of the node N1. If the positive pulse is outputted, we obtain V2>V1. Assuming that on-resistance of the MOSFET M4 is small, the potential V2 of the node N2 becomes equal to the power-supply potential $V_{DD}$. Thus, a voltage applied to the primary side of the pulse transformer 3 is considered to be:

$$V2-V1 \approx V_{DD}-V1$$

In this case, assuming that a desired output voltage is Vexp, it is necessary to perform control such that the output voltage Vexp becomes equal to $(V_{DD}-V1)/n$. $(V_{DD}-V1)/n$ is compared with the output voltage Vexp, so that current is decreased if $(V_{DD}-V1)/n$ is larger while being increased if $(V_{DD}-V1)/n$ is smaller. This current control is performed by the first comparator 1.

If and when the positive pulse is outputted, the switching device 4 is switched to the side of the terminal a, resulting in Vr=V1. Thus, the potential V1 of the node N1 is applied to the non-inverted input terminal of the first comparator 1. If V1>$Vref_1$, the output voltage of the first comparator 1, i.e., the gate voltage $V_G$ of the MOSFET M5 becomes high. Consequently, more current flows on the primary side of the pulse transformer 3. On the contrary, if V1<$Vref_1$, the output volta $V_G$ of the first comparator 1 becomes low. Consequently, current flowing on the primary side of the pulse transformer 3 becomes less. In the above described manner, the current flowing through the pulse transformer 3 is controlled such that V1=$Vref_1$. Assuming that the first reference voltage $Vref_1$ is set such that $$Vref_1 = V_{DD} - Vexp \cdot n$$

we obtain:

$$V1 = Vref_1 = V_{DD} - Vexp \cdot n$$

$$V_{DD} - V1 = Vexp \cdot n$$

$$V2 - V1 \approx V_{exp} \cdot n$$

$$\therefore (V2 - V1)/n = V_{exp}$$

Thus, control is performed such that the height of the output pulse becomes Vexp.

Meanwhile, if and when the negative pulse is outputted, a control method is the same as that in the above described case except that points where Vr=V2 differ from each other.

In the above described manner, the heights of the output pulse at the time of loads of 50Ω and 400Ω can be controlled to 750mV.

Then, when the load becomes small, for example, 5.6Ω, the current flowing through the pulse transformer 3 attempts to increase to keep constant the output voltage. However, at the time of the load of 5.6Ω, it is determined that the height of the output pulse is 150mV or less, so that the increase in current must be prevented. When the load is low, a second comparator 2 controls the height of the output pulse to a constant value or less.

The second comparator 2 compares the output voltage $V_G$ of the first comparator 1 with a second reference voltage Vref$_2$. When VG<Vref$_2$, the output voltage of the second comparator 2 is high, so that the MOSFET M6 is turned off. When VG>Vref$_2$, the output voltage of the second comparator 2 becomes low, so that the MOSFET M6 is turned on, to be operated to lower the output voltage of the first comparator 1, i.e., the gate volta $V_G$ of the MOSFET M5. In the above described manner, control is performed such that the output voltage $V_G$ is not the second reference voltage Vref$_2$ or more. Thus, the current which can flow through the MOSFET M5 is controlled by the second reference voltage Vref$_2$, so that control is performed such that the height of the pulse is not a given value or more when the load is small.

As described in the foregoing the height of the output pulse is adjusted to a constant value by the function of the first comparator 1 when the load is large to some extent while being limited not to exceed a constant value by the function of the second comparator when the load is small. Thus, a driver circuit is achieved which satisfies the pulse mask determined in the above described Recommendation I. 430 of the CCITT.

Meanwhile, the first reference voltage Vref$_1$ is adjusted so that the height of the output pulse can be adjusted. In addition, the second reference voltage Vref$_2$ is adjusted so that a limited value of an output current can be changed.

Figure 6:
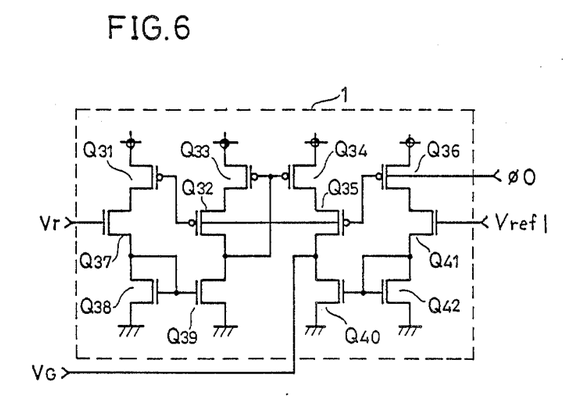
FIG. 6 is a diagram showing a circuit structure of a first comparator shown in FIG. 5.

FIG. 6 is a circuit diagram showing a circuit structure of the first comparator 1 shown in FIG. 5.

The first comparator 1 is structured by a CMOS circuit comprising P channel MOSFETs Q31 to Q36 and N channel MOSFETs Q37 to Q42. The MOSFET Q37 has its gate receiving a controlled voltage Vr, and the MOSFET Q41 has its gate receiving a first reference voltage Vref$_1$. An output voltage $V_G$ is derived from a node of the MOSFETs Q35 and Q40.

Meanwhile, in the first comparator 1, each of the MOSFETs Q31, Q32, Q35 and Q36 has its gate receiving a control signal $\phi0$. This control signal $\phi0$ is generally at a ground level. However, the control signal $\phi0$ is brought to a $V_{DD}$ level at the standby time, so that current flowing from a power-supply potential $V_{DD}$ to a ground potential is disconnected. As a result, current consumption is reduced.

Figure 7:
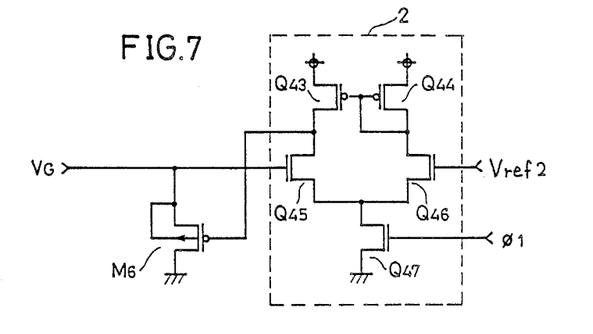
FIG. 7 is a diagram showing a circuit structure of a second comparator shown in FIG. 5.

FIG. 7 is a circuit diagram showing a circuit structure of the second comparator 2 shown in FIG. 5.

The second comparator 2 is constituted by a CMOS circuit comprising P channel MOSFETs Q43 and Q44 and N channel MOSFETs Q45 to Q47. The MOSFET Q55 has its gate receiving an output voltage $V_G$ of the first comparator 1, and the MOSFET Q46 has its gate receiving a second reference voltage Vref$_2$. An output voltage is derived from a node of the MOSFETs Q43 and Q45. The MOSFET Q47 has its gate receiving a control signal $\phi1$. This control signal $\phi1$ is generally at a level. However, the control signal $\phi1$ is brought to a ground level at the standby time, so that current consumption is reduced.

Figure 8:
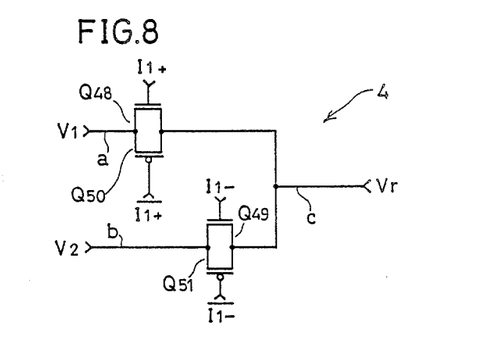
FIG. 8 is a diagram showing a circuit structure of a switching device shown in FIG. 5.

FIG. 8 is a diagram showing a circuit structure of the switching device 4 shown in FIG. 5.

The switching device 4 is structured by a CMOS circuit comprising N channel MOSFETs Q48 and Q49 and P channel MOSFETs Q50 and Q51. The MOSFET Q48 has its gate receiving an input signal I1$_+$, and the MOSFET Q50 has its gate receiving the inverted signal I1$_+$. The MOSFET Q49 has its gate receiving an input signal I1$_-$, and the MOSFET Q51 has its gate receiving the inverted signal I1$_-$. When the input signal I1$_+$ is at an "H" level, a terminal a is connected to a terminal c. When the input signal I1$_-$ is at an "H" level, a terminal b is connected to the terminal c.

Figure 9:
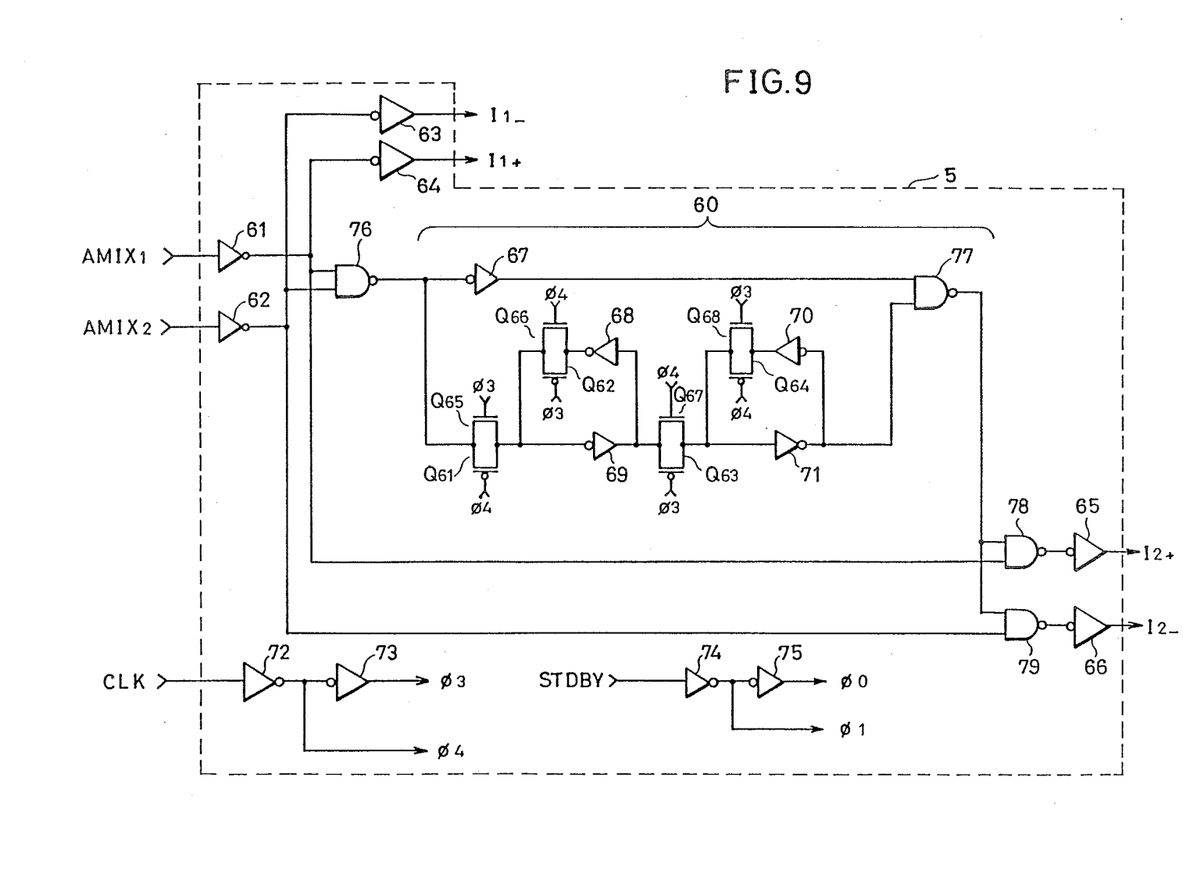
FIG. 9 is a diagram showing a circuit structure of a digital control circuit shown in FIG. 5.

FIG. 9 is a diagram showing a circuit structure of the digital control circuit 5 shown in FIG. 5.

The digital control circuit 5 is constituted by a CMOS circuit comprising inverters 61 to 75, NAND gates 76 to 79, P channel MOS transistors Q61 to Q64, and N channel MOS transistors Q65 to Q68. A positive pulse output signal AMIX1 is applied to the inverter 61, and a negative pulse output signal AMIX2 is applied to the inverter 62. A clock signal CLK is applied to the inverter 72, and a standby signal STDBY is applied to the inverter 74. At the time of a standby mode, the standby signal STDBY attains an "H" level.

An input signal I1$_+$ to the MOSFET M1 is outputted from the inverter 64, and an input signal I1$_-$ to the MOSFET M2 is outputted from the inverter 63. In addition, an input signal I2$_-$ to the MOSFET M3 is outputted from the inverter 66, and an input signal I2$_+$ to the MOSFET M4 is outputted from the inverter 65. A control signal $\phi3$ in phase with the clock signal CLK is outputted from the inverter 73, and a control signal $\phi4$ out of phase with the clock signal CLK is outputted from the inverter 72. A control signal $\phi0$ in phase with the standby signal STDBY is outputted from the inverter 75, and a control signal $\phi1$ out of phase with the standby signal STDBY is outputted from the inverter 74.

Figure 10:
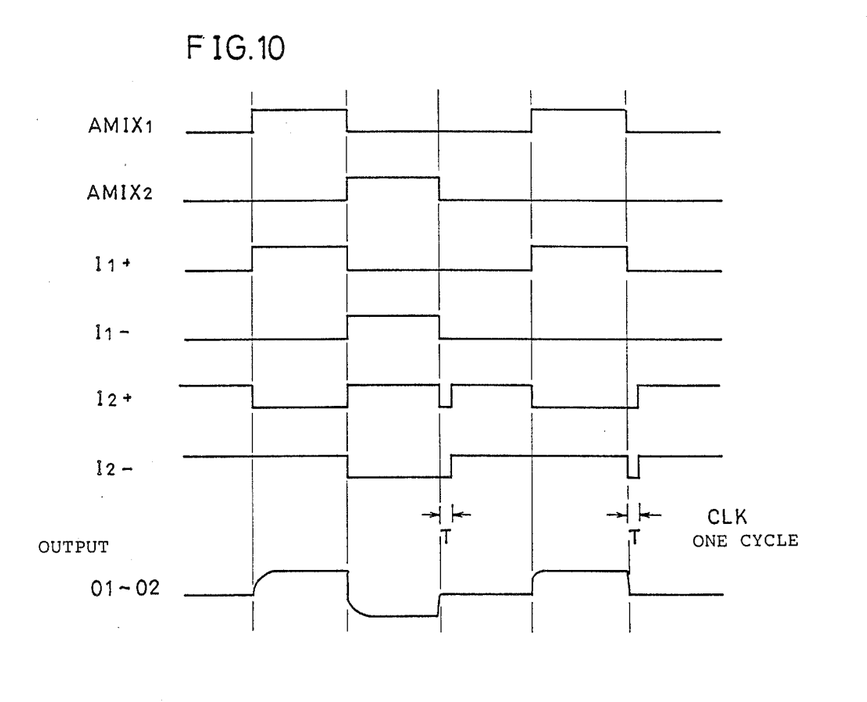
FIG. 10 is a timing chart for explaining an operation of the digital control circuit shown in FIG. 9.

Referring now to a timing chart of FIG. 10, description is made on an operation of the digital control circuit 5.

When the positive pulse output signal AMIX1 is at the "H" level and the negative pulse output signal AMIX2 is at the "L" level, the input signals I1$_+$ and I2$_-$ attain the "H" level and the input signals I1$_-$ and I2$_+$ attain the "L" level. Consequently, the MOSFETs M1 and M4 are turned on and the MOSFETs M2 and M3 are turned off, so that a positive pulse is outputted between output terminals O1 and O2. On the contrary, when the positive pulse output signal AMIX1 is at the "L" level and the negative pulse output signal AMIX2 is at the "H" level, the input signals I1$_-$ and I2$_+$ attain the "H" level and the input signals I1$_+$ and I2$_-$ attain the "L" level. Consequently, the MOSFETs M2 and M3 are turned on and the MOSFETs M1 and M4 are turned off, so that a negative pulse is outputted between the output terminals O1 and O2.

Meanwhile, when both the positive pulse output signal AMIX1 and the negative pulse output signal AMIX2 are at the "L" level, the input signals I1+ and I1− attain the "L" level and the input signals I2+ and I2− attain the "H" level, so that all the MOSFETs M1 to M4 are turned off. Consequently, a high impedance state is achieved between the output terminals O1 and O2. Thus, a terminal which does not provide a pulse never affects another terminal.

Meanwhile, transition is suddenly made from a state in which a pulse is outputted to a state in which all the MOSFETs M1 to M4 are turned off, undershoot generally occurs in a final end of the pulse. In the digital control circuit 5 shown in FIG. 9, there is provided a delay circuit portion 60 to prevent occurrence of this undershoot. Thus, after the input signals I1+ and I1− fall to the "L" level, so that the MOSFETs M1 and M2 are turned off, the input signals I2+ and I2− fall to the "L" level only during a period corresponding to one cycle T of the clock signal CLK. Consequently, the MOSFETs M3 and M4 are turned on during the period T and then, turned off, so that occurrence of the undershoot is prevented.

Although in the above described embodiment, both positive and negative pulses can be generated, only either one of the positive and negative pulses may be generated, in which case either one of a set of the MOSFETs M1 and M4 and a set of the MOSFETs M2 and M3 and the switching device 4 are not generated. In this case, the non-inverted input terminal of the first comparator 1 is connected to one at the lower potential out of the nodes N1 and N2.

Figure 11:
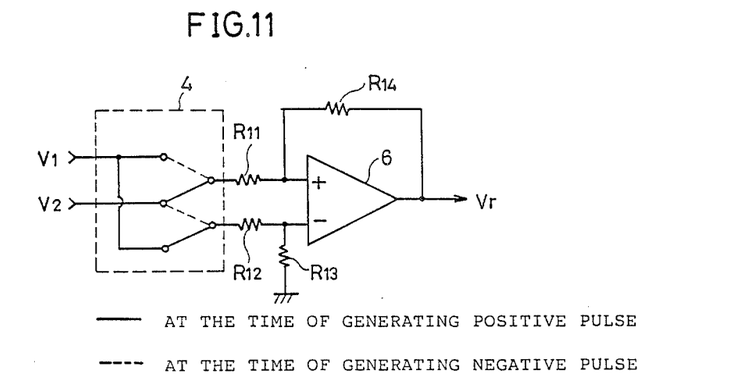
FIG. 11 is a diagram showing a modified example of the switching device and the peripheral portions shown in FIG. 5.

Additionally, in the above described embodiment, the voltage V2−V1 applied to the primary side of the pulse transformer 3 is approximated by $V_{DD}-V1$. Furthermore, if and when the accuracy is required, it is necessary to employ a circuit shown in FIG. 11. In FIG. 11, when a positive pulse is outputted, a switching device 4 is switched as represented by a solid line. Consequently, a potential V1 of a node N1 is applied to an inverted input terminal of an operational amplifier 6 through a resistor R12, and a potential V2 of a node N2 is applied to a non-inverted input terminal of the operational amplifier 6 through a resistor R11. In addition, when a negative pulse is outputted, the switching device 4 is switched as represented by a broken line. Consequently, the potential of the node N1 is applied to the non-inverted input terminal of the operational amplifier 6 through the resistor R11, and the potential V2 of the node N2 is applied to the inverted input terminal of the operational amplifier 6 through the register R12. A controlled voltage Vr outputted from the operational amplifier 6 becomes V1−V2.

As described in the foregoing, the driver circuit shown in FIG. 5 can be constituted by the CMOS circuit shown in FIGS. 6 to 9. Thus, the driver circuit in the above described embodiment can be incorporated together with another CMOS digital circuit in hybrid configuration at low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A driver circuit receiving an input signal and providing an output voltage corresponding thereto, comprising:

a pair of input terminals receiving said input signal, a pair of output terminals, voltage transforming means having a pair of primary terminals connected to said pair of input terminals and a pair of secondary terminals connected to said pair of output terminals, first comparing means for comparing a voltage between said pair of input terminals with a predetermined first reference voltage, to provide an output voltage corresponding to the difference therebetween, a first field effect device having a control terminal receiving said output voltage of said first comparing means for controlling current flowing through said voltage transforming means such that the voltage between said pair of input terminals becomes equal to said first reference voltage, second comparing means for comparing said output voltage of said first comparing means with a predetermined second reference voltage, to provide an output voltage corresponding to the difference therebetween, and a second field effect device having a control terminal receiving said output voltage of said second comparing means for performing control such that the absolute value of said output voltage of said first comparing means does not exceed a predetermined value.

2. A driver circuit receiving an input signal and providing an output voltage corresponding thereto, comprising:

a pair of input terminals receiving said input signal, a pair of output terminals, voltage transforming means comprising a pulse transformer having a pair of primary terminals connected to said pair of input terminals and a pair of secondary terminals connected to said pair of output terminals, first comparing means for comparing a voltage between said pair of input terminals with a predetermined first reference voltage, to provide an output voltage corresponding to the difference therebetween, a first field effect device having a control terminal receiving said output voltage of said first comparing means for controlling current flowing through said voltage transforming means such that the voltage between said pair of input terminals becomes equal to said first reference voltage, second comparing means for comparing said output voltage of said first comparing means with a predetermined second reference voltage, to provide an output voltage corresponding to the difference therebetween, and a second field effect device having a control terminal receiving said output voltage of the second comparing means for performing control such that the absolute value of said output voltage of said first comparing means does not exceed a predetermined value.

3. A driver circuit receiving an input signal and providing an output voltage corresponding thereto, comprising:
- a pair of input terminals receiving said input signal,
- a pair of output terminals,
- voltage transforming means comprising a pulse transformer having a pair of primary terminals connected to said pair of input terminals and a pair of secondary terminals connected to said pair of output terminals,
- first comparing means for comparing a voltage between said pair of input terminals with a predetermined first reference voltage, to provide an output voltage corresponding to the difference therebetween,
- a first field effect device having a control terminal receiving said output voltage of said first comparing means for controlling current flowing through said voltage transforming means such that the voltage between said pair of input terminals becomes equal to said first reference voltage,
- second comparing means for comparing said output voltage of said first comparing means with a predetermined second reference voltage, to provide an output voltage corresponding to the difference therebetween, and
- a second field effect device having a control terminal receiving said output voltage of the second comparing means for performing control such that the absolute value of said output voltage of said first comparing means does not exceed a predetermined value,
- each of said first and second comparing means comprising a CMOS circuit, and
- each of said first and second field effect devices comprising a MOS field effect transistor.

4. The driver circuit according to claim 3, wherein each of said first and second comparing means comprises an operational amplifier.

5. The driver circuit according to claim 1, wherein
- said first comparing means comprises one input terminal connected to one or the other of said pair of input terminals, another input terminal receiving said first reference voltage, and an output terminal providing an output voltage corresponding to the difference between a voltage of said one input terminal and a voltage of said other input terminal, and
- said second comparing means comprises one input terminal receiving said output voltage of said first comparing means, another input terminal receiving said second reference voltage, and an output terminal providing an output voltage corresponding to the difference between a voltage of said one input terminal and a voltage of said other input terminal.

6. The driver circuit according to claim 5, wherein
- said first field effect device comprises a MOS field effect transistor comprising one conduction terminal coupled to one or the other of said pair of input terminals, another conduction terminal receiving a predetermined potential, and a gate terminal receiving said output voltage of said first comparing means, and
- said second field effect device comprises one conduction terminal receiving said output voltage of said first comparing means, another conduction terminal receiving a predetermined potential, and a gate terminal receiving said output voltage of said second comparing means.

7. The driver circuit according to claim 5, which further comprises a switching device for selectively connecting said one input terminal of said first comparing means to one or the other of said pair of input terminals.

8. The driver circuit according to claim 5, which further comprises
- an operational amplifier comprising one input terminal, another input terminal, an output terminal connected to said one input terminal of said second comparing means, and
- switching means for selectively connecting said one input terminal of said operational amplifier to one or the other of said pair of input terminals.

9. The driver circuit according to claim 6, which further comprises
- signal generating means receiving said input signal for generating first and second signals,
- a third field effect device coupled between said one conduction terminal of said first field effect device and one of said pair of input terminals and responsive to said first signal to be rendered conductive, and
- a fourth field effect device coupled between a predetermined power-supply potential and the other of said pair of input terminals and responsive to said second signal to be rendered conductive.

10. The driver circuit according to claim 6, which further comprises
- signal generating means receiving said input signal for selectively generating first and second signals or third and fourth signals,
- a third field effect device coupled between said one conduction terminal of said first field effect device and one of said pair of input terminals and responsive to said first signal to be rendered conductive,
- a fourth field effect device coupled between a predetermined power-supply potential and the other of said pair of input terminals and responsive to said second signal to be rendered conductive,
- a fifth field effect device coupled between said one conduction terminal of said first field effect device and said other of said pair of input terminals and responsive to said third signal to be rendered conductive, and
- a sixth field effect device coupled between said predetermined power-supply potential and said one of said pair of input terminals and responsive to said fourth signal to be rendered conductive.

11. The driver circuit according to claim 10, wherein
- said input signal comprises first and second input signals, and
- said signal generating means generates said first and second signals when said first input signal is at a predetermined logical level while generating said third and fourth signals when said second input signal is at a predetermined logical level.

12. The driver circuit according to claim 11, which further comprises switching means, said switching means comprising
- a first transfer gate comprising an N channel MOS field effect transistor and a P channel MOS field effect transistor connected between one of said pair of input terminals and said one input terminal of said first comparing means and responsive to said first or second signal to be rendered conductive, and a second transfer gate comprising an N channel MOS field effect transistor and a P channel MOS field effect transistor connected between the other of said pair of input terminals and said one input terminal of said first comparing means and responsive to said third or fourth signal to be rendered conductive.

13. The driver circuit according to claim 11, wherein said second and fourth signals are rendered active in a predetermined period after said first and third signals are rendered inactive.

14. A driver circuit comprising:

a pair of input terminals, a pair of output terminals, a pulse transformer having a pair of primary terminals connected to said pair of input terminals and a pair of secondary terminals connected to said pair of output terminals, a first operational amplifier having a non-inverted input terminal selectively connected to one or the other of said pair of input terminals, an inverted input terminal receiving a predetermined first reference voltage, and an output terminal providing an output voltage corresponding to the potential difference between said non-inverted input terminal and said inverted input terminal, a second operational amplifier having an inverted input terminal receiving said output voltage of said first operational amplifier, a non-inverted input terminal receiving a predetermined second reference voltage, and an output terminal providing an output voltage corresponding to the potential difference between said inverted input terminal and said non-inverted input terminal, an N channel MOS field effect transistor having one conduction terminal, another conduction terminal coupled to a ground potential, and a gate terminal receiving said output voltage of said first operational amplifier, a P channel MOS field effect transistor having one conduction terminal receiving said output voltage of said first operational amplifier, another conduction terminal coupled to a ground potential, and a gate terminal receiving said output voltage of said second operational amplifier, a switching device for selectively connecting said non-inverted input terminal of said first operational amplifier to one or the other of said pair of input terminals, signal generating means receiving first and second input signals externally applied for selectively generating first and second signals or third and fourth signals, a first MOS field effect transistor coupled between said one conduction terminal of said N channel MOS field effect transistor and one of said pair of input terminals and responsive to said first signal to be rendered conductive, a second MOS field effect transistor coupled between a predetermined power-supply potential and the other of said pair of input terminals and responsive to said second signal to be rendered conductive, a third MOS field effect transistor coupled between said one conduction terminal of said N channel MOS field effect transistor and said other of said pair of input terminals and responsive to said third signal to be rendered conductive, and a fourth MOS field effect transistor coupled between said predetermined power-supply potential and said one of said pair of input terminals and responsive to said fourth signal to be rendered conductive.

* * * * *